US011727996B2

(12) United States Patent
Singidi et al.

(10) Patent No.: US 11,727,996 B2
(45) Date of Patent: Aug. 15, 2023

(54) DYNAMIC VALLEY SEARCHING IN SOLID STATE DRIVES

(71) Applicant: Western Digital Technologies, Inc., San Jose, CA (US)

(72) Inventors: Harish Singidi, Fremont, CA (US); Amiya Banerjee, Bangalore (IN); Shantanu Gupta, Freemont, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/961,468

(22) Filed: Oct. 6, 2022

(65) Prior Publication Data

US 2023/0023725 A1    Jan. 26, 2023

Related U.S. Application Data

(63) Continuation of application No. 17/197,488, filed on Mar. 10, 2021, now Pat. No. 11,468,953.

(51) Int. Cl.
*G11C 16/26* (2006.01)
*G11C 16/10* (2006.01)
(Continued)

(52) U.S. Cl.
CPC .............. *G11C 16/26* (2013.01); *G11C 7/106* (2013.01); *G11C 7/1087* (2013.01); *G11C 16/10* (2013.01);
(Continued)

(58) Field of Classification Search
CPC ....... G11C 16/26; G11C 7/106; G11C 7/1087; G11C 16/10; G11C 16/3459;
(Continued)

(56) References Cited

U.S. PATENT DOCUMENTS 9,472,298 B1    10/2016  Louie et al.
9,710,325 B2    7/2017   Chen et al.
(Continued)

OTHER PUBLICATIONS

Li, Q. et al., "A fast read retry method for 3D NAND flash memories using novel valley search algorithm" IEICE Electronics Express, Vo. 15, No. 22, pp. 1-7, Oct. 30, 2018.

*Primary Examiner* — Xiaochun L Chen
(74) *Attorney, Agent, or Firm* — Ravi Mohan; Rutan & Tucker, LLP

(57) ABSTRACT

A storage device can reorganize a sequentially performed calibration task and delegate various steps of the task to multiple memory planes. By utilizing a characteristic that provides for similar memory device responses across multiple planes, the calibration task processed on one memory plane can be applied to another memory plane within the device. In this way, partial calibration data may be generated across a plurality of memory planes, and subsequently pooled together to generate a unified calibration data that can be utilized on each of the plurality of planes to do a full calibrated read on memory devices, thus reducing the amount of time needed to perform a calibrated read. Reduced times for calibrated reads allows for increased resolution of threshold valley scans, increased lifespan of the storage device, improved read times, and also provides for data write methods to use less memory during intermediate multi-pass programming steps.

20 Claims, 10 Drawing Sheets

(51) Int. Cl.
  *G11C 7/10*  (2006.01)
  *G11C 16/34*  (2006.01)
(52) U.S. Cl.
  CPC .. *G11C 16/3459* (2013.01); *G11C 2207/2254* (2013.01)
(58) Field of Classification Search
  CPC .... G11C 2207/2254; G11C 2029/0409; G11C 11/5642; G11C 29/021; G11C 29/028
  See application file for complete search history.

(56) References Cited

U.S. PATENT DOCUMENTS

| | | |
|---|---|---|
| 10,109,361 B1 | 10/2018 | Khakifirooz et al. |
| 2020/0090762 A1 | 3/2020 | Shirakawa et al. |
| 2020/0098436 A1 | 3/2020 | Kim et al. |
| 2021/0183456 A1* | 6/2021 | Muchherla .......... G06F 11/3037 |
| 2022/0093184 A1 | 3/2022 | Kim et al. |

* cited by examiner

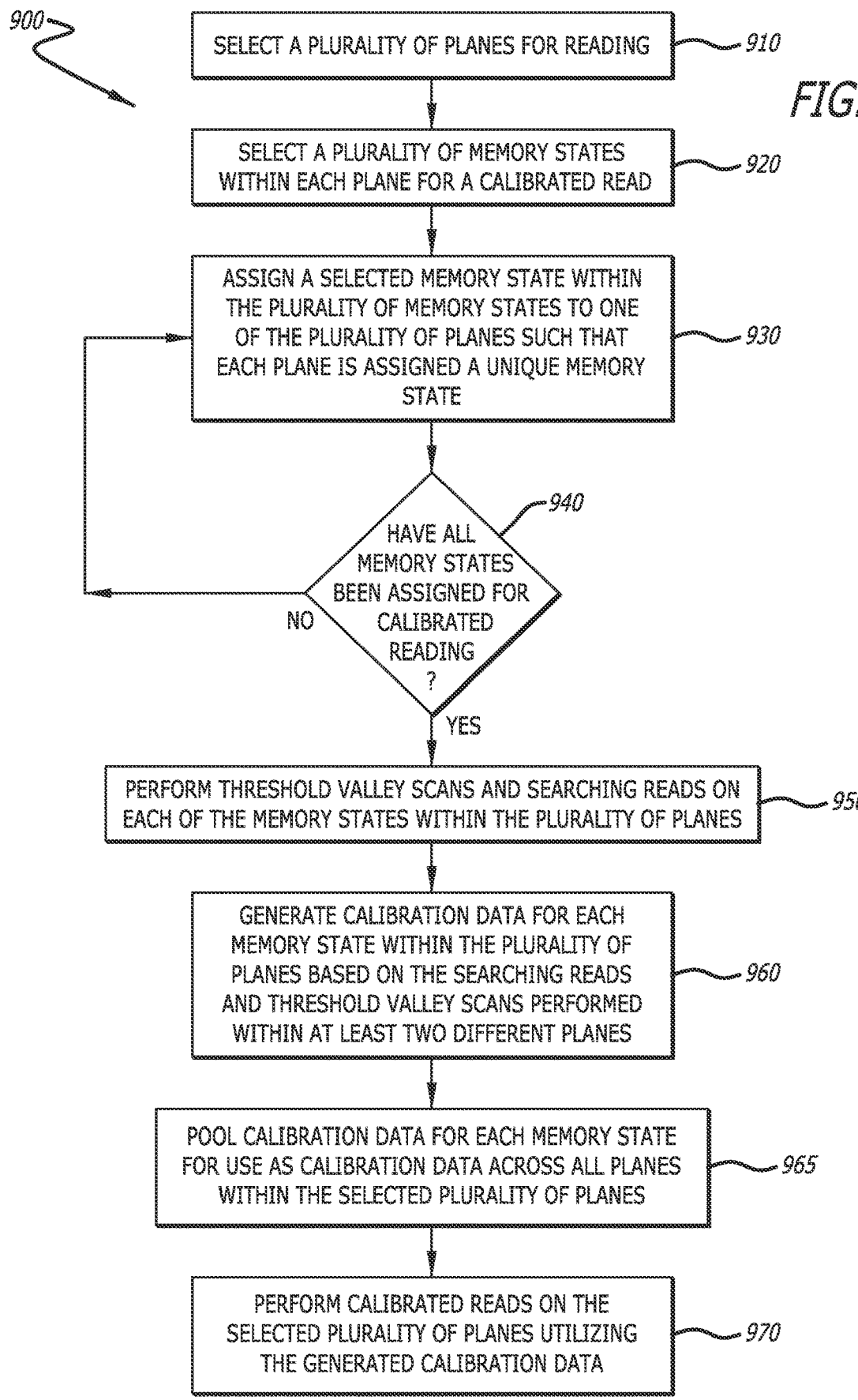

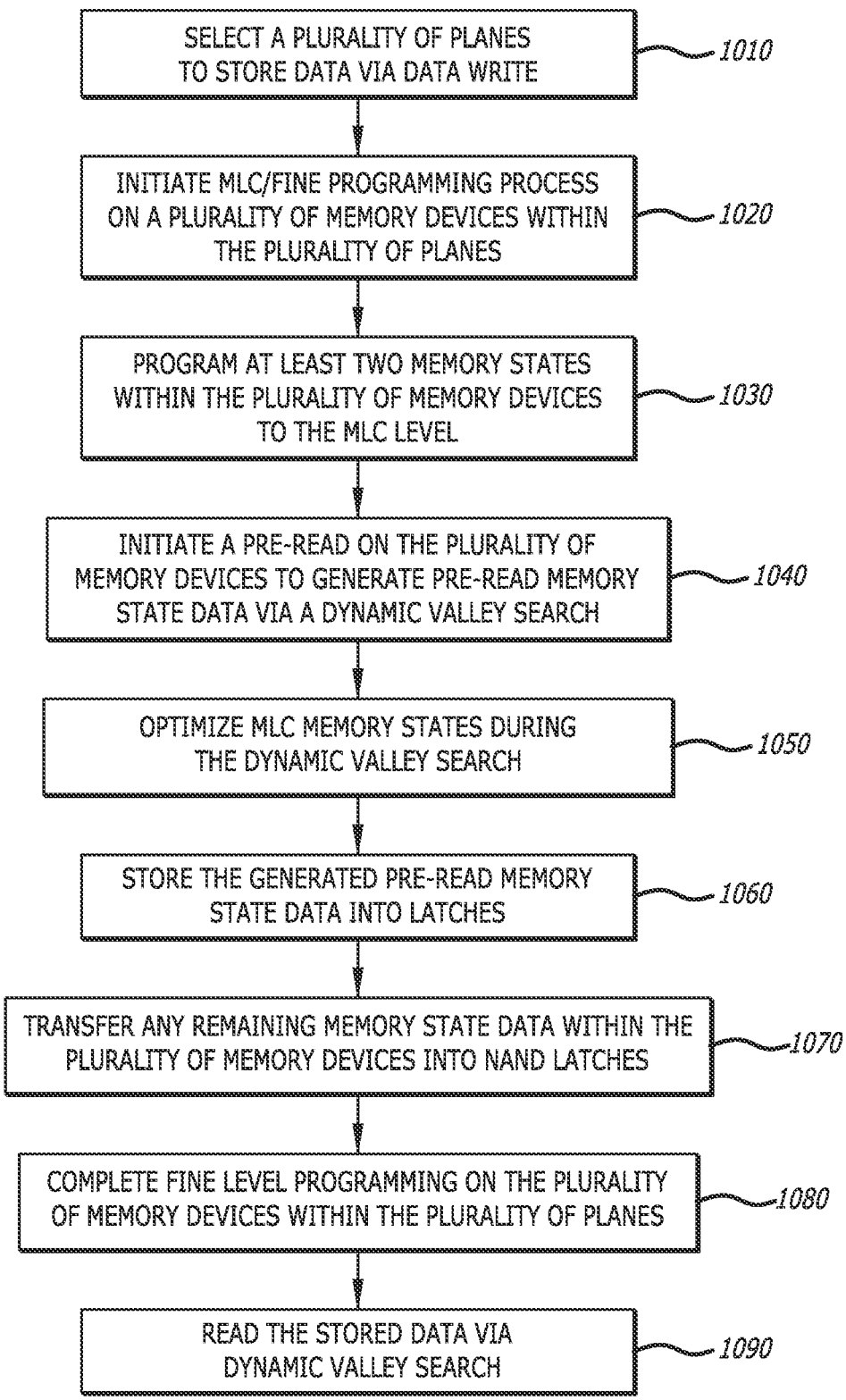

DYNAMIC VALLEY SEARCHING IN SOLID STATE DRIVES

PRIORITY CLAIM

This application claims the benefit of and priority to U.S. patent application Ser. No. 17/197,488, filed Mar. 10, 2021, now issued U.S. Pat. No. 11,468,953, which is incorporated in its entirety herein.

FIELD

The present disclosure relates to storage systems. More particularly, the present disclosure relates to utilizing valley searching memory reads across multiple planes of solid state memory devices.

BACKGROUND

Storage devices are ubiquitous within computing systems. Recently, solid-state memory devices capable of nonvolatile storage of charge have become the predominant choice within various consumer electronics products. Popular types of solid-state memory devices include flash-type electrically erasable programmable read-only memory ("EEPROM"). These memory devices are typically NAND-based which can be erased and have new data written or "programmed" into memory cells.

The electrical programming of memory devices is completed by setting a threshold voltage to a particular level that can be later read and decoded to a particular bit or series of bits of data. However, due to various issues such as program disturb, read disturb, and lifetime retention, among others, the actual threshold voltage within the memory devices can change from the original programmed threshold voltage. These issues result in the increase of errors or failed bit counts within the memory devices.

To counter this phenomenon, various methods have been developed and are utilized within solid-state storage devices. Error correction code (ECC) may be deployed to correct errors but has limitations on the maximum number of errors that it may process. Another method of minimizing these issues utilizes a valley scan which attempts to measure the spaces or "valleys" between the threshold voltages within various memory devices. By scanning and measuring these valleys, a more detailed picture of the actual threshold voltage (compared to the programmed threshold voltage) may be realized and subsequently utilized to calibrate any future reads of that memory device. As memory devices increase in age and use, optimizing the read levels based upon measured threshold voltage changes becomes more essential.

However, as the complexity and bit count within memory devices becomes larger and more complex, utilizing valley scans creates longer read times as more valleys require scanning in each memory device. While a traditional single-level cell (SLC) memory device may only have one valley to measure, more current quad-level memory (QLC) comprises fifteen valleys. Thus, for each stored bit added to the memory device, the number of valleys to be scanned more than doubles. Additionally, the resolution of the valley scan may also be adjusted to reduce the time required for reads, but consequently results in lower accuracy in the results. Thus, alternative techniques have been utilized to provide similarly accurate results with reduced read times.

BRIEF DESCRIPTION OF DRAWINGS

The above, and other, aspects, features, and advantages of several embodiments of the present disclosure will be more apparent from the following description as presented in conjunction with the following several figures of the drawings.

FIG. 9 is a flowchart depicting a process for performing a dynamic valley search across multiple planes of memory in accordance with an embodiment of the disclosure; and FIG. 10 is a flowchart depicting a process for utilizing dynamic valley searches within read and write cycles of a storage device in accordance with an embodiment of the disclosure.

Figure 1:
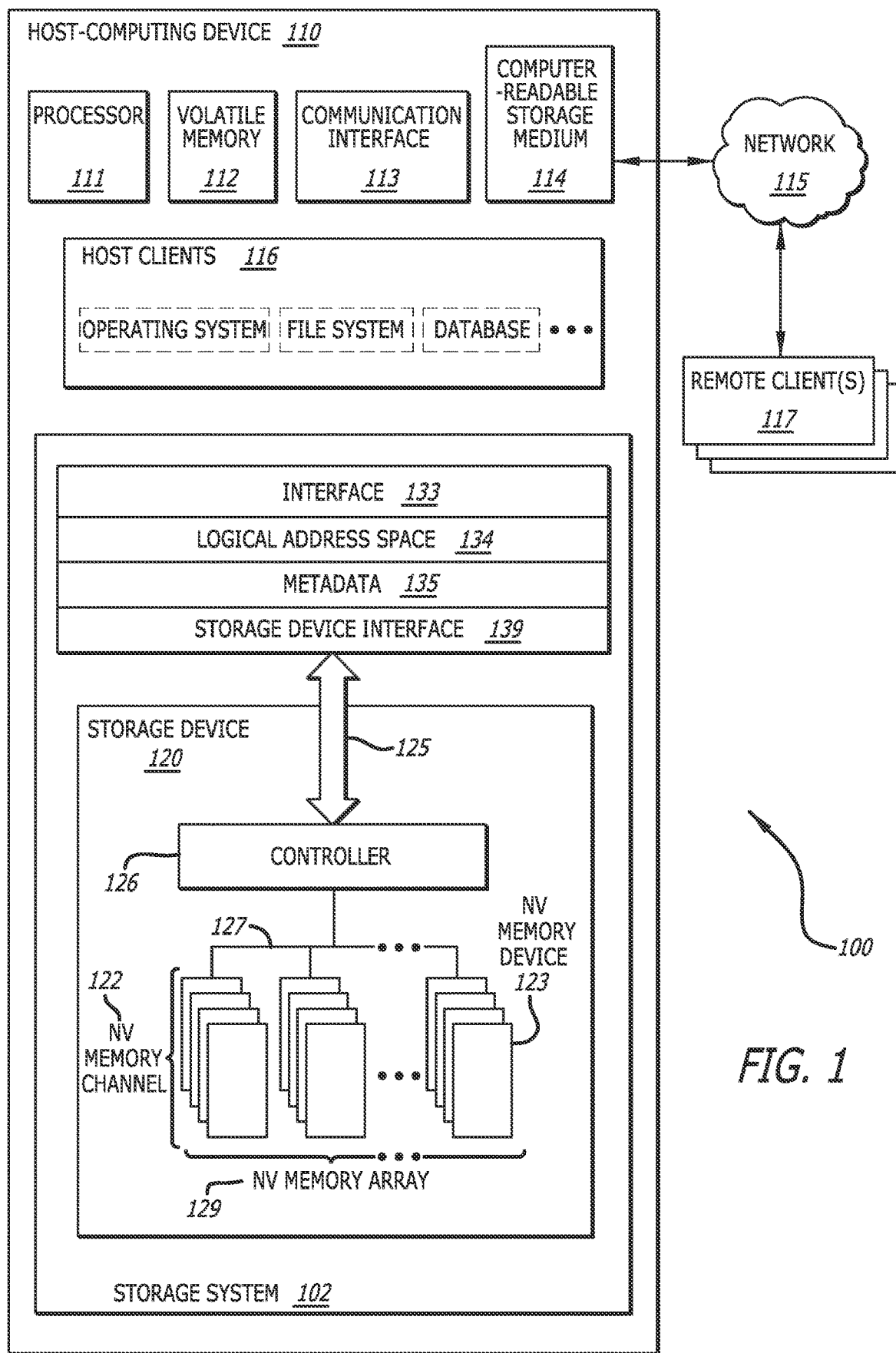
FIG. 1 is schematic block diagram of a host-computing device with a storage device suitable for dynamic valley searches in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the problems described above, systems and methods for effectively performing dynamic valley searches across multiple planes of a storage device are described herein. Specifically, by utilizing a characteristic of multiple planes of communicatively coupled memory devices, the task of performing threshold valley searches can be divided, segmented or otherwise split and assigned to various memory planes. This division of labor allows for fewer threshold valley searches to be performed, thereby lowering the time required to scan prior to completing the request data read. Once initial calibration data has been generated on each memory plane, it can be pooled together and shared among all other memory planes such that each memory plane will be able to piece together calibration data to perform a calibrated read on all necessary memory states, even though the memory plane had only performed a partial searching read and/or threshold valley search.

In various embodiments, these methods of performing threshold valley searches across multiple memory planes can reduce the time required to perform the required calibration by between 50 and 80%. As those skilled in the art will recognize, as memory devices have become more complex, the usefulness of threshold valley searches decreases due to the time required to perform the operations which decreases response read time. However, with the dynamic valley search methods and systems described herein, the threshold valley search method can become more optimal over other methods of calibration. Indeed, because of the reduced time to generate calibration data with dynamic valley searches, the resolution of the threshold valley searches can be increased to provide results that are more accurate than competing methods. Indeed, many embodiments of storage devices can operate the dynamic valley searches with no or minimal need for additional hardware or processing requirements compared to other methods. Finally, the dynamic valley search process can be utilized within the writing of data to bolster the MLC/fine multi-pass programming method. In this way, intermediate MLC values can be stored within latches with greater certainty, reducing the need for latches compared to other multi-pass programming methods such as the foggy/fine method.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like.

Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1, a schematic block diagram of a host-computing device 110 with a storage system 102 suitable for dynamic valley searches in accordance with an embodiment of the disclosure is shown. The write-abort detection system 100 comprises one or more storage devices 120 of a storage system 102 within a host-computing device 110 in communication via a controller 126. The host-computing device 110 may include a processor 111, volatile memory 112, and a communication interface 113. The processor 111 may include one or more central processing units, one or more general-purpose processors, one or more application-specific processors, one or more virtual processors (e.g., the host-computing device 110 may be a virtual machine operating within a host), one or more processor cores, or the like. The communication interface 113 may include one or more network interfaces configured to communicatively couple the host-computing device 110 and/or controller 126 of the storage device 120 to a communication network 115, such as an Internet Protocol (IP) network, a Storage Area Network (SAN), wireless network, wired network, or the like.

The storage device 120, in various embodiments, may be disposed in one or more different locations relative to the host-computing device 110. In one embodiment, the storage device 120 comprises one or more non-volatile memory devices 123, such as semiconductor chips or packages or other integrated circuit devices disposed on one or more printed circuit boards, storage housings, and/or other mechanical and/or electrical support structures. For example, the storage device 120 may comprise one or more direct inline memory module (DIMM) cards, one or more expansion cards and/or daughter cards, a solid-state drive (SSD) or other hard drive device, and/or may have another memory and/or storage form factor. The storage device 120 may be integrated with and/or mounted on a motherboard of the host-computing device 110, installed in a port and/or slot of the host-computing device 110, installed on a different host-computing device 110 and/or a dedicated storage appliance on the network 115, in communication with the host-computing device 110 over an external bus (e.g., an external hard drive), or the like.

The storage device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the storage device 120 may be disposed on a peripheral bus of the host-computing device 110, such as a peripheral component interconnect express (PCI Express or PCIe) bus such, as but not limited to a NVM Express (NVMe) interface, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the storage device 120 may be disposed on a network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The host-computing device 110 may further comprise computer-readable storage medium 114. The computer-readable storage medium 114 may comprise executable instructions configured to cause the host-computing device 110 (e.g., processor 111) to perform steps of one or more of the methods disclosed herein. Additionally, or in the alternative, the buffering component 150 may be embodied as one or more computer-readable instructions stored on the computer readable storage medium 114.

A device driver and/or the controller 126, in certain embodiments, may present a logical address space 134 to the host clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the storage device 120 may maintain metadata 135, such as a logical to physical address mapping structure, to map logical addresses of the logical address space 134 to media storage locations on the storage device(s) 120. A device driver may be configured to provide storage services to one or more host clients 116. The host clients 116 may include local clients operating on the host-computing device 110 and/or remote host clients 117 accessible via the network 115 and/or communication interface 113. The host clients 116 may include, but are not limited to: operating systems, file systems, database applications, server applications, kernel-level processes, user-level processes, applications, and the like.

The device driver may be further communicatively coupled to one or more storage systems 102 which may include different types and configurations of storage devices 120 including, but not limited to: solid-state storage devices, semiconductor storage devices, SAN storage resources, or the like. The one or more storage devices 120 may comprise one or more respective controllers 126 and non-volatile memory channels 122. The device driver may provide access to the one or more storage devices 120 via any compatible protocols or interface 133 such as, but not limited to, SATA and PCIe. The metadata 135 may be used to manage and/or track data operations performed through the protocols or interfaces 133. The logical address space 134 may comprise a plurality of logical addresses, each corresponding to respective media locations of the one or more storage devices 120. The device driver may maintain metadata 135 comprising any-to-any mappings between logical addresses and media locations.

A device driver may further comprise and/or be in communication with a storage device interface 139 configured to transfer data, commands, and/or queries to the one or more storage devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The storage device interface 139 may communicate with the one or more storage devices 120 using input-output control (IO-CTL) command(s), IO-CTL command extension(s), remote direct memory access, or the like.

The communication interface 113 may comprise one or more network interfaces configured to communicatively couple the host-computing device 110 and/or the controller 126 to a network 115 and/or to one or more remote host clients 117. The controller 126 is part of and/or in communication with one or more storage devices 120. Although FIG. 1 depicts a single storage device 120, the disclosure is not limited in this regard and could be adapted to incorporate any number of storage devices 120.

The storage device 120 may comprise one or more non-volatile memory devices 123 of non-volatile memory channels 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory devices 123 of the non-volatile memory channels 122, in certain embodiments, comprise storage class memory (SCM) (e.g., write in place memory, or the like).

While the non-volatile memory channels 122 is referred to herein as "memory media," in various embodiments, the non-volatile memory channels 122 may more generally comprise one or more non-volatile recording media capable of recording data, which may be referred to as a non-volatile memory medium, a non-volatile memory device, or the like. Further, the storage device 120, in various embodiments, may comprise a non-volatile recording device, a non-volatile memory array 129, a plurality of interconnected storage devices in an array, or the like.

The non-volatile memory channels 122 may comprise one or more non-volatile memory devices 123, which may include, but are not limited to: chips, packages, planes, die, or the like. A controller 126 may be configured to manage data operations on the non-volatile memory channels 122, and may comprise one or more processors, programmable processors (e.g., FPGAs), ASICs, micro-controllers, or the like. In some embodiments, the controller 126 is configured to store data on and/or read data from the non-volatile memory channels 122, to transfer data to/from the storage device 120, and so on.

The controller 126 may be communicatively coupled to the non-volatile memory channels 122 by way of a bus 127. The bus 127 may comprise an I/O bus for communicating data to/from the non-volatile memory devices 123. The bus 127 may further comprise a control bus for communicating addressing and other command and control information to the non-volatile memory devices 123. In some embodiments, the bus 127 may communicatively couple the non-volatile memory devices 123 to the controller 126 in parallel. This parallel access may allow the non-volatile memory devices 123 to be managed as a group, forming a non-volatile memory array 129. The non-volatile memory devices 123 may be partitioned into respective logical memory units (e.g., logical pages) and/or logical memory divisions (e.g., logical blocks). The logical memory units may be formed by logically combining physical memory units of each of the non-volatile memory devices 123.

The controller 126 may organize a block of word lines within a non-volatile memory device 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory device 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the host-computing device 110. A device driver may provide storage services to the host clients 116 via one or more interfaces 133. A device driver may further comprise a storage device interface 139 that is configured to transfer data, commands, and/or queries to the controller 126 over a bus 125, as described above.

Figure 2:
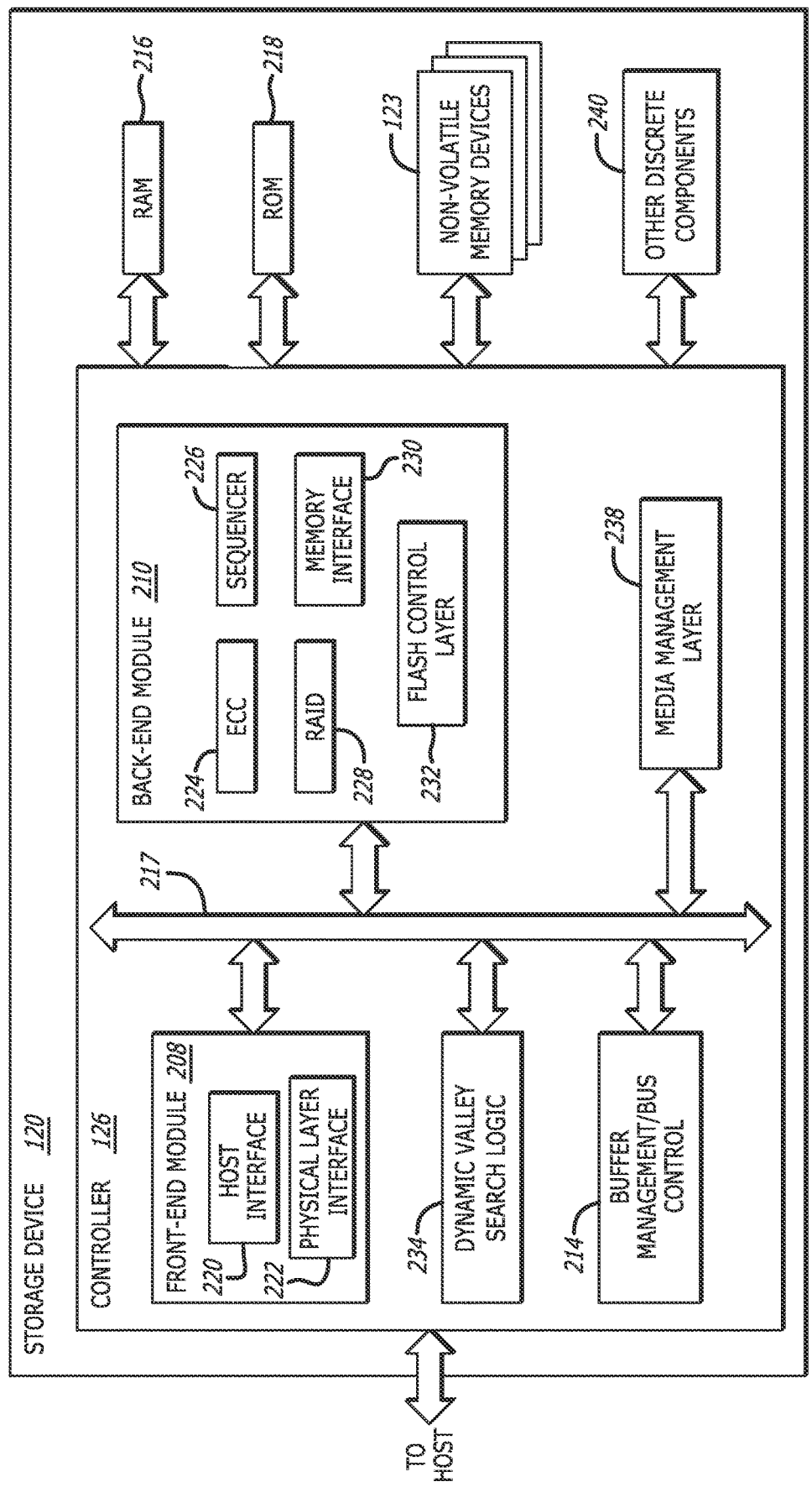
FIG. 2 is a schematic block diagram of a storage device suitable for dynamic valley searches in accordance with an embodiment of the disclosure.

Referring to FIG. 2, a schematic block diagram of a storage device 120 suitable for dynamic valley searches in accordance with an embodiment of the disclosure. The controller 126 may include a front-end module 208 that interfaces with a host, a back-end module 210 that interfaces with the non-volatile memory devices 123, and various other modules that perform various functions of the storage device 120. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 126 may include a buffer management/bus control module 214 that manages buffers in random access memory (RAM) 216 and controls the internal bus arbitration for communication on an internal communications bus 217 of the controller 126. A read only memory (ROM) 218 may store and/or access system boot code. Although illustrated in FIG. 2 as located separately from the controller 126, in other embodiments one or both of the RAM 216 and the ROM 218 may be located within the controller 126. In yet other embodiments, portions of RAM 216 and ROM 218 may be located both within the controller 126 and outside the controller 126. Further, in some implementations, the controller 126, the RAM 216, and the ROM 218 may be located on separate semiconductor dies. As discussed below, in one implementation, the submission queues and the completion queues may be stored in a controller memory buffer, which may be housed in RAM 216.

Additionally, the front-end module 208 may include a host interface 220 and a physical layer interface 222 that provides the electrical interface with the host or next level storage controller. The choice of the type of the host interface 220 can depend on the type of memory being used. Examples types of the host interfaces 220 may include, but are not limited to, SATA, SATA Express, SAS, Fibre Channel, USB, PCIe, and NVMe. The host interface 220 may typically facilitate transfer for data, control signals, and timing signals.

The back-end module 210 may include an error correction controller (ECC) engine 224 that encodes the data bytes received from the host and decodes and error corrects the data bytes read from the non-volatile memory devices 123. The back-end module 210 may also include a command sequencer 226 that generates command sequences, such as program, read, and erase command sequences, to be transmitted to the non-volatile memory devices 123. Additionally, the back-end module 210 may include a RAID (Redundant Array of Independent Drives) module 228 that manages generation of RAID parity and recovery of failed data. The RAID parity may be used as an additional level of integrity protection for the data being written into the storage device 120. In some cases, the RAID module 228 may be a part of the ECC engine 224. A memory interface 230 provides the command sequences to the non-volatile memory devices 123 and receives status information from the non-volatile memory devices 123. Along with the command sequences and status information, data to be programmed into and read from the non-volatile memory devices 123 may be communicated through the memory interface 230. A flash control layer 232 may control the overall operation of back-end module 210.

Additional modules of the storage device 120 illustrated in FIG. 2 may include a media management layer 238, which performs wear leveling of memory cells of the non-volatile memory devices 123. The storage device 120 may also include other discrete components 240, such as external electrical interfaces, external RAM, resistors, capacitors, or other components that may interface with controller 126. In alternative embodiments, one or more of the RAID modules 228, media management layer 238 and buffer management/bus control 214 are optional components that may not be necessary in the controller 126.

Finally, the controller 126 may also comprise a dynamic valley search logic 234 that can be configured to initiate, process, and or other manage the dynamic valley search process. In many embodiments, the need for utilizing dynamic valley searches may not occur initially. Indeed, a large benefit of dynamic valley searches is to verify stored memory values to programmed values. The differences between these values may not often differ too much initially within the storage device, and may only start to increase (necessitating the use of dynamic valley searching) at a certain point in the lifespan of the storage device.

In a number of embodiments, the dynamic valley search logic 234 may monitor the storage device for various factors to determine when the dynamic valley search process may start or other used to generate calibration data. In some embodiments, the metric for determining use of the dynamic valley search method may be related to the overall lifespan of the devices as measured in data cycles written to the memory devices. In further embodiments, the decision to implement dynamic valley searching may be done at the memory device level up to the storage device level. In still further embodiments, the decision may be related to a static metric such as fifty percent of the lifespan of the drive (although this number can be changed depending on other factors). The measurement of the lifespan of the storage device may be related to evaluating the current number of memory device read counts against a known estimate for a total number of read counts. In this way, the generated calibration data can be utilized to reduce the fail bit counts of the device and improve the overall lifespan of the storage device.

The process outlined below, especially with reference to FIG. 9, may also be directed by the dynamic valley search logic 234. By way of non-limiting example, the determination of memory states to operate on, or the assignment of those memory states to memory planes for calibration can also be determined within the dynamic valley search logic 234. Indeed, various embodiments may operate this logic without intervention by the controller or host processor.

Figure 3:
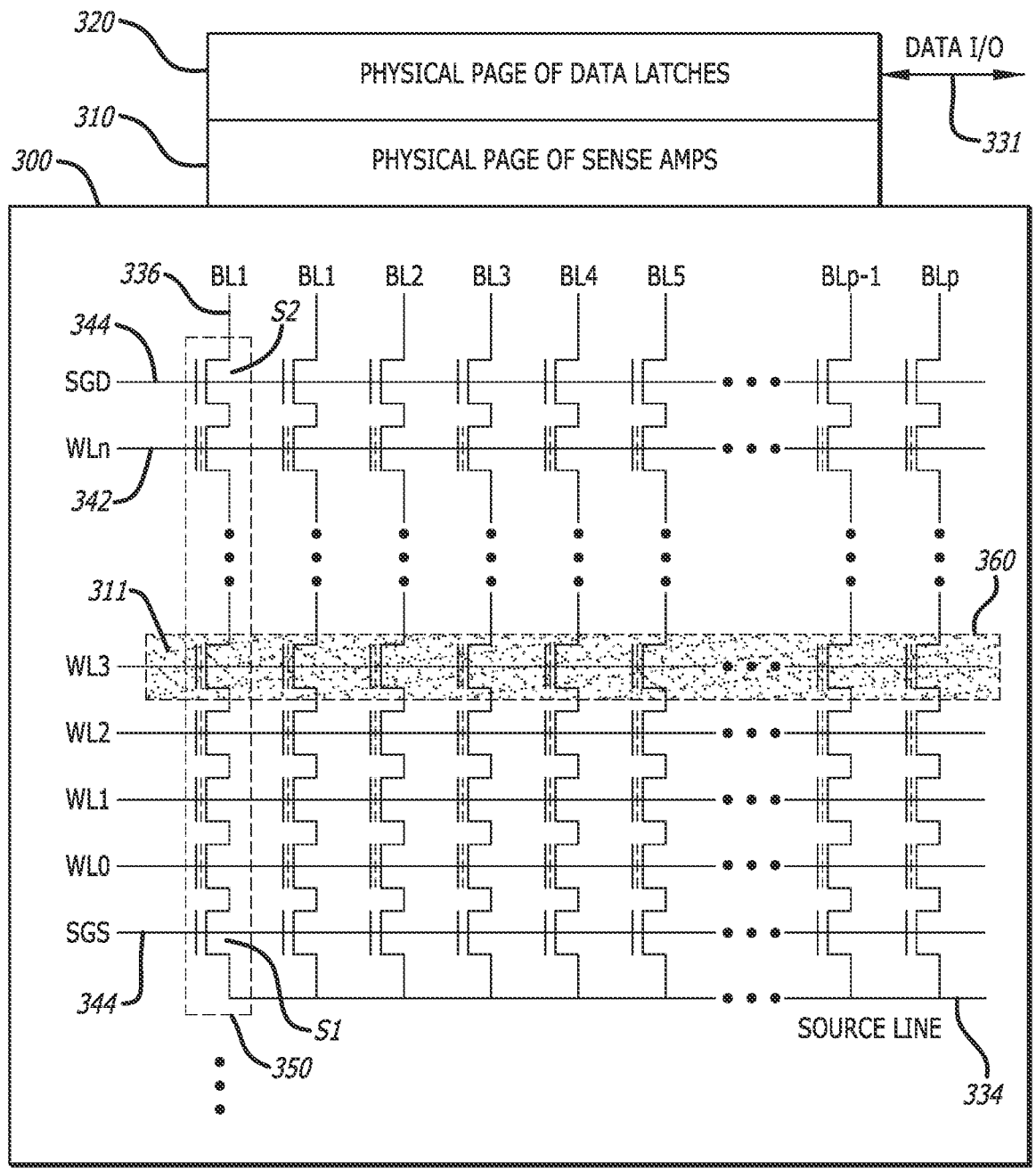
FIG. 3 is a conceptual illustration of a page of memory cells, organized for example in the NAND configuration, being sensed or programmed in parallel in accordance with an embodiment of the disclosure.

Referring to FIG. 3, a conceptual illustration of a page of memory cells, organized for example in the NAND configuration 300, being sensed or programmed in parallel in accordance with an embodiment of the disclosure is shown. FIG. 3 conceptually shows a bank of NAND strings 350 within a non-volatile memory device 123 of FIG. 1. A "page" such as the page 360, is a group of memory cells enabled to be sensed or programmed in parallel. This is accomplished in the peripheral circuits by a corresponding page of sense amplifiers 310. The sensed results are utilized in latches within a corresponding set of data latches 320. Each sense amplifier can be coupled to a NAND string, such as NAND string 350 via a bit line 336. For example, the page 360 is along a row and is sensed by a sensing voltage applied to the control gates of the cells of the page connected in common to the word line WL3. Along each column, each memory cell such as memory cell 311 is accessible by a sense amplifier via a bit line 336. Data in the data latches 320 are toggled in from or out to the controller 126 via a data I/O bus 331.

The NAND string 350 can be a series of memory cells, such as memory cell 311, daisy-chained by their sources and drains to form a source terminal and a drain terminal respective at its two ends. A pair of select transistors S1, S2 can control the memory cell chain's connection to the external source via the NAND string's source terminal and drain terminal, respectively. In a memory array, when the source select transistor S1 is turned on, the source terminal is coupled to a source line 334. Similarly, when the drain select transistor S2 is turned on, the drain terminal of the NAND string is coupled to a bit line 336 of the memory array. Each memory cell 311 in the chain acts to store a charge. It has a charge storage element to store a given amount of charge so as to represent an intended memory state. In many embodiments, a control gate within each memory cell can allow for control over read and write operations. Often, the control gates of corresponding memory cells of each row within a plurality of NAND strings are all connected to the same word line (such as WL0. WL1 . . . WLn 342). Similarly, a control gate of each of the select transistors S1, S2 (accessed via select lines 344 SGS and SGD respectively) provides control access to the NAND string via its source terminal and drain terminal respectively.

While the example memory device referred to above comprises physical page memory cells that store single bits of data, in most embodiments each cell is storing multi-bit data, and each physical page can have multiple data pages. Additionally, in further embodiments, physical pages may store one or more logical sectors of data. Typically, the host-computing device 110 (see FIG. 1) operating with a disk operating system manages the storage of a file by organizing the content of the file in units of logical sectors, which is typically in one or more units of 512 bytes. In some embodiments, a physical page may have 16 kB of memory cells being sensed in parallel by corresponding 16 kB of sense amplifiers via 16 kB of bit lines. An example logical sector assigned by the host has a size of 2 kB of data. Thus, a physical page can store 8 sectors if the cells are each configured to store 1 bit of data (SLC). For MLC, TLC, and QLC and other increased density structures, each cell can store 2, 3, 4 or more bits of data, and each physical page can store 16, 32, 64 or more logical sectors depending on the structure utilized.

One unique difference between flash memory and other types of memory is that a memory cell must be programmed from an erased state which is associated with no charge within the memory cell. This requires that the floating gate must first be emptied of charge prior to programming. Programming adds a desired amount of charge back to the floating gate. It does not support removing a portion of the charge from the floating to go from a more programmed state to a lesser one. Thus, new data cannot overwrite existing data and must be written to a previously unwritten or erased location. Furthermore, erasing all the charges from a floating gate can often take an appreciable amount of time. For that reason, it will be cumbersome and inefficient to erase cell by cell or even page by page. Therefore, in most embodiments, the array of memory cells is often divided into a large number of blocks. As is common in many flash-based memory systems, the block is the unit of erase. That is, each block contains the minimum number of memory cells that are erased in one action. This combined with the limited lifespans of memory cells within the flash memory increases the desire to limit the amount of erasing and programming occurring within the storage device.

Figure 4:
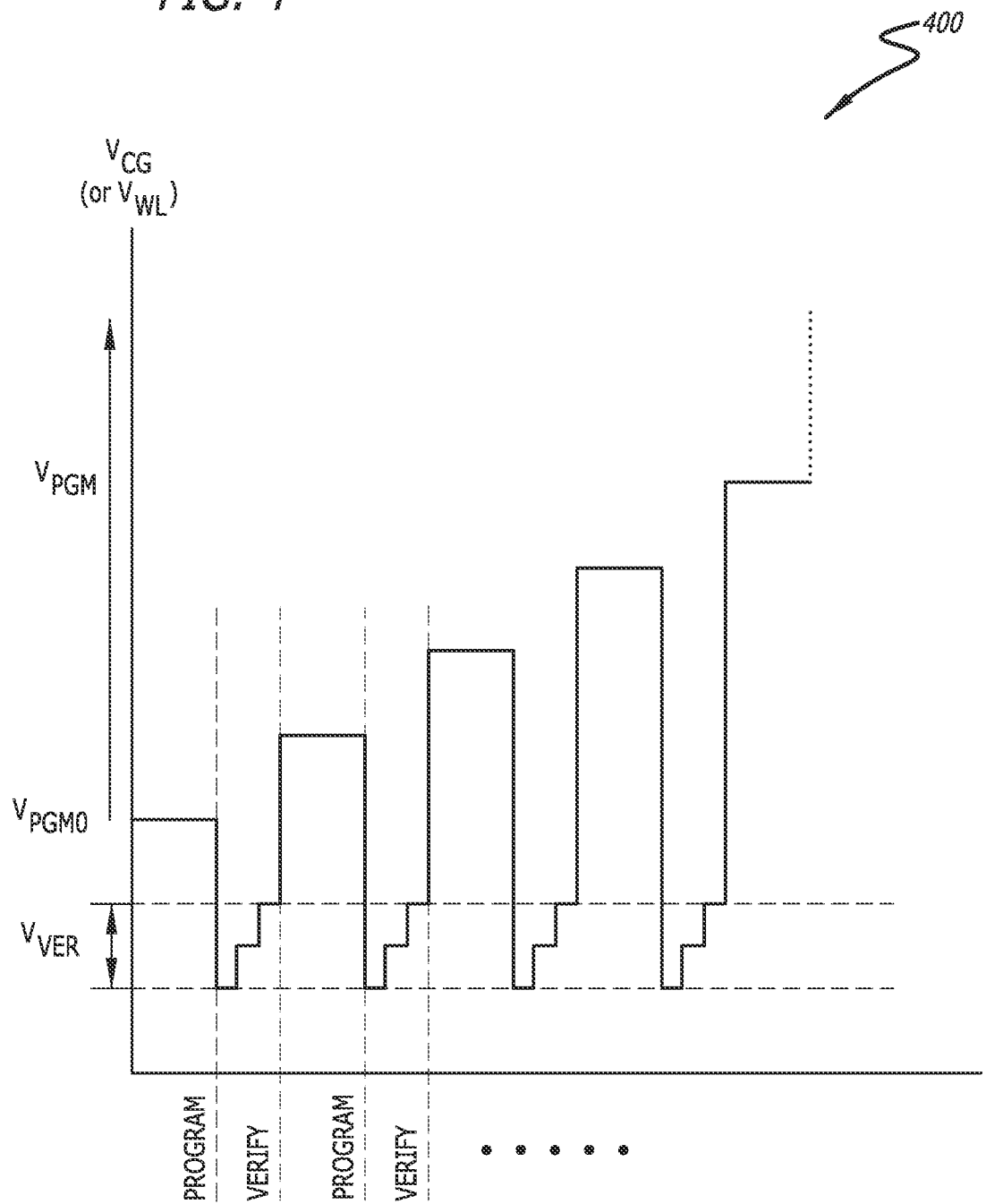
FIG. 4 is a conceptual illustration of a series of programming voltage pulses in the form of a staircase waveform being applied to a selected word line in accordance with embodiments of the disclosure.

Referring to FIG. 4, a conceptual illustration of a series of programming voltage pulses 400 in the form of a staircase waveform being applied to a selected word line in accordance with embodiments of the disclosure is shown. When a cell is programmed to a given state, it is often subject to successive programming voltage pulses to add incremental charges to the floating gate (seen within the "program" windows). In between programming pulses, the cell is often measured or verified to determine its source-drain current relative to a breakpoint level (seen within the "verify" windows).

In many embodiments, memory cell programming stops when it has been verified to reach the desired state ($V_{CG}$ or $V_{WL}$). The programming pulses used may have increasing period or amplitude in order to counter act the accumulating electrons programmed into the charge storage unit of the memory cell. The programming pulse level ($V_{PGM0}$) is often the initial pass and is then ramped up over successive programming passes through the program voltage levels (VPGM). A pulse that moves more charge into a memory cell than another is said to be coarser while a pulse that moves less charge is considered to comprise a finer granularity. Memory cell programming circuits generally apply a series of programming pulses to a selected word line. In this way, a page of memory cells whose control gates are connected to the word line can be programmed together. Whenever a memory cell of the page has been programmed to its target state, it can become program-inhibited while the other cells continue to be subject to further programming until all memory cells of the page have been program-verified.

Generally, an erased cell has no charge in its floating gate and has roughly the lowest threshold voltage. As the memory cell is increasingly programmed with more charges into the floating gate, its associated threshold voltage increases. Memory cells generally operate within a range of threshold voltages, often called a threshold window. The threshold window can be partitioned into a plurality of subranges or bands of threshold voltages, each representing a memory state. For field-effect transistors with a floating gate, the charges programmed into the floating gate of a memory cell can determine its threshold voltage which in turn determines what memory state it is currently in. However, advanced age of the memory device or other effects (such as the Yupin effect) may alter the actual stored voltage within the floating gate compared to the voltage originally programmed. Thus, a memory cell may register as having more or less charge than it actually has, creating a virtual effect that changes its threshold voltage and associated data stored within.

One method to reduce negative memory device effects is to adopt a multi-pass programming scheme for programming a page of memory cells on a word line in parallel. In a first programming pass, the memory cells targeted to the more programmed states (ones that will have their threshold voltages moved from an erased state at a lower end of the threshold window to a higher end) are initially programmed to a staging area near halfway of the threshold window. In subsequent programming passes, the memory cells are programmed from the staging area to their final target destinations. In this way, the difference between the first and second field environment seen by a memory cell is due to the threshold voltages of its neighbors not moving across the full extent but at most across half of the threshold window.

A conventional method of implementing the above-mentioned multi-pass programming is performed as a series of binary programs, in which at each programming pass the threshold window is binary divided and memory cells with target states belonging to the upper half of the binary divisions are programmed to the lower middle portion of the binary divisions. Each further programming pass iterates the binary division programming until in a final programming pass all memory cells of the page are programmed to their final destinations. Another popular method of multi-pass programming is a foggy/fine method that utilizes coarser programming to set a rough approximation of the charges (foggy step) and then utilizes more granular programming pulses to refine the memory states within the threshold window until the data has been stored successfully (fine step).

As described earlier, an example of nonvolatile memory is formed from an array of field-effect transistors, each having a charge storage layer between its channel region and its control gate. The charge storage layer or unit can store a range of charges, giving rise to a range of threshold voltages for each field-effect transistor. The range of possible threshold voltages can span through a threshold window. When the threshold window is partitioned into multiple subranges or zones of threshold voltages, each resolvable zone can be used to represent a different memory state for a memory cell. The multiple memory states can be coded by one or more binary bits. In SLC memory, each memory cell stores one bit of data. In MLC, TLC, and QLC memory structures, each memory cell can store 2, 3 or 4 bits of data. It is contemplated that further increased memory structures may be utilized in response to novel methods of resolving smaller zones within threshold windows.

Figure 5:
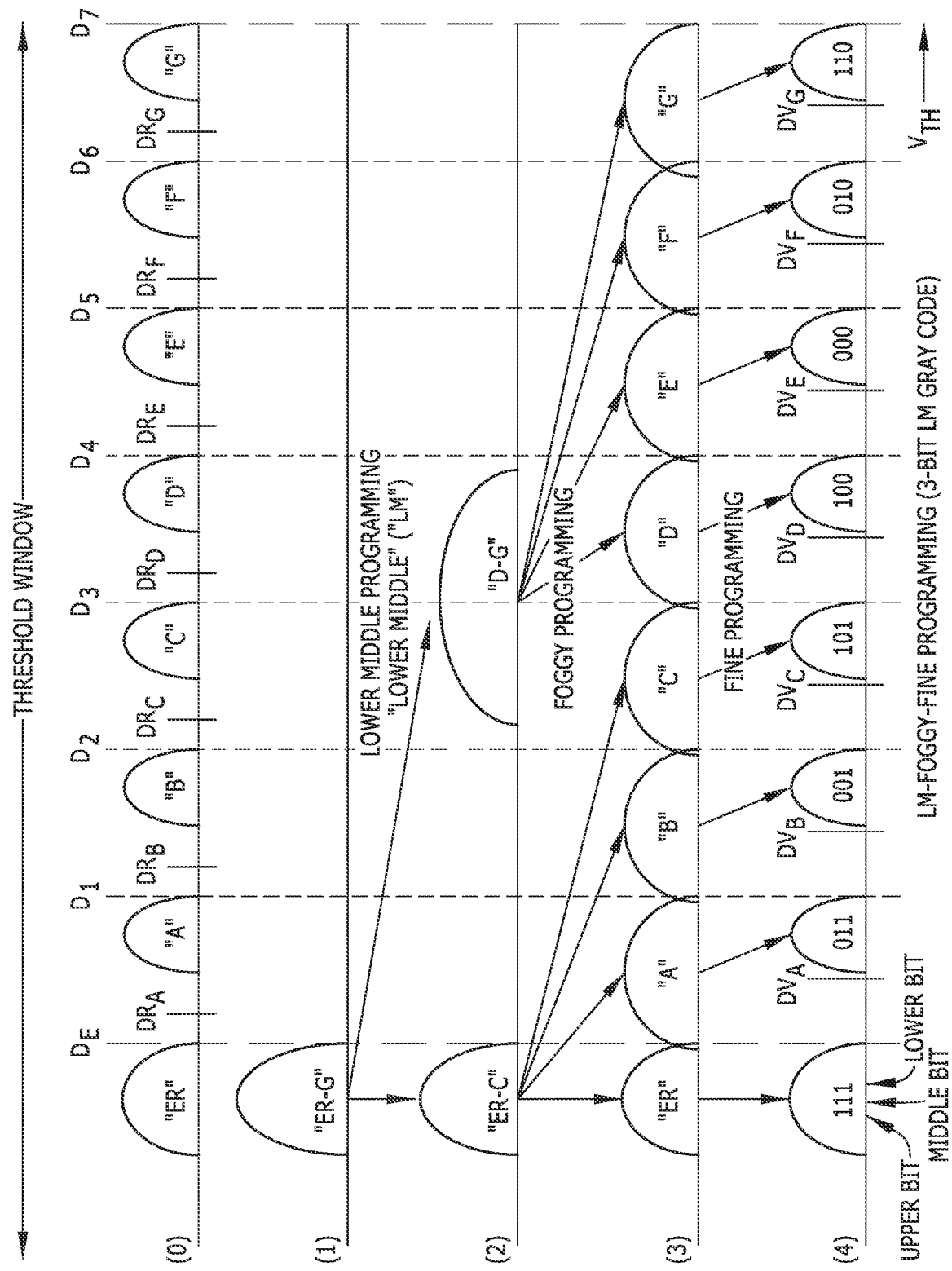
FIG. 5 is a conceptual illustration of a foggy/fine multi-pass programming scheme of a 3-bit memory cell in accordance with an embodiment of the disclosure.

Referring to FIG. 5, a conceptual illustration of a foggy/fine multi-pass programming scheme of a 3-bit memory cell in accordance with an embodiment of the disclosure is shown. FIGS. 5(0)-5(4) illustrate the programming of an 8-state memory programmed with a multi-pass foggy/fine programming method. Although this figure depicts a 3-bit TLC memory structure, it is contemplated and explained in more detail below that this method can be applied to QLC and other memory structures with higher bit densities per voltage threshold window. FIG. 5(0) illustrates the typical threshold voltage distributions of an 8-state memory array. The possible threshold voltages of each memory cell can span a threshold window which is partitioned in this embodiment into eight regions by demarcation threshold voltage points $D_E$-$D_7$ to demarcate respectively eight possible memory states, "Er", "A", "B", "C", "D", "E", "F" and "G". "Er" is a ground state, which is considered an erased state and "A"-"G" are seven progressively programmed states. During a read, the eight states are demarcated by seven demarcation read points, $DR_A$-$DR_G$.

FIG. 5(4) illustrates a representation of the eight possible memory states. Each of the eight memory states is represented by a triplet of "upper", "middle", and "lower" bits, namely "111", "011", "001", "101", "100", "000, "010 and "110" respectively. As is evident from FIG. 5(3), the final programming pass results in only a small change in the threshold voltages of all the memory cells. This translates to smaller changes in the charge stored within each memory cell, thereby minimizing many negative effects.

FIG. 5(1) indicates a memory cell that is suitable for programming via multi-pass foggy/fine programming. The "erased" state is labelled "Er-G" as it indicates that this threshold voltage may be increased to cover any of the potential voltage states within the memory cell. As shown in FIG. 5(2), after the first round programming, each cell remains in the "erased" or "Er" state if the lower bit is "1" or programmed to a "lower middle" ("LM") state if the lower bit is "0". In other words, the "Er" or "ground" state is the "erased" state with a tightened distribution by having the deeply erased states programmed to within a narrow range of threshold values. The "lower middle" states may have a broad distribution of threshold voltages that are straddled between memory states such as "B" and "D". During programming, the "lower middle" state can be verified relative to a coarse breakpoint threshold level such as D.

FIG. 5(3) illustrates that a second pass of a foggy/fine multi-pass programming method will program all the memory cells close to their destinations. These foggy voltage states include "Er" along with "A-G" as in FIG. 5(0). This second pass programming is referred to as "foggy" as it is still performed coarsely with coarse programming pulses to increase speed but is often finer than that of the first LM pass. This is typically followed by a third "fine" programming pass, as shown in FIG. 5(4), which trims the trailing edge of the threshold distribution of each state using still finer programming pulses. The verify threshold points for each pass can be dependent on the granularity of the programming pulses. Each placement is such that a memory cell will first be verified at the verify threshold before it can get over-programmed to a designated threshold value. As for 4-bit, 5-bit and higher bit foggy/fine multi-pass programming, the same principles can apply wherein an n-bit code would have n data pages with each page formed from every cell in a page contributing a given bit of the code.

It will be understood by those skilled in the art, that multi-pass programming typically includes multiple "passes" at each stage, and although FIG. 5 depicts 3 stages of programming, additional passes are often necessary for each stage. Indeed, in certain embodiments, programming a memory cell within either the foggy or fine step may require multiple, if not dozens of passes to achieve the proper voltage levels.

Figure 6:
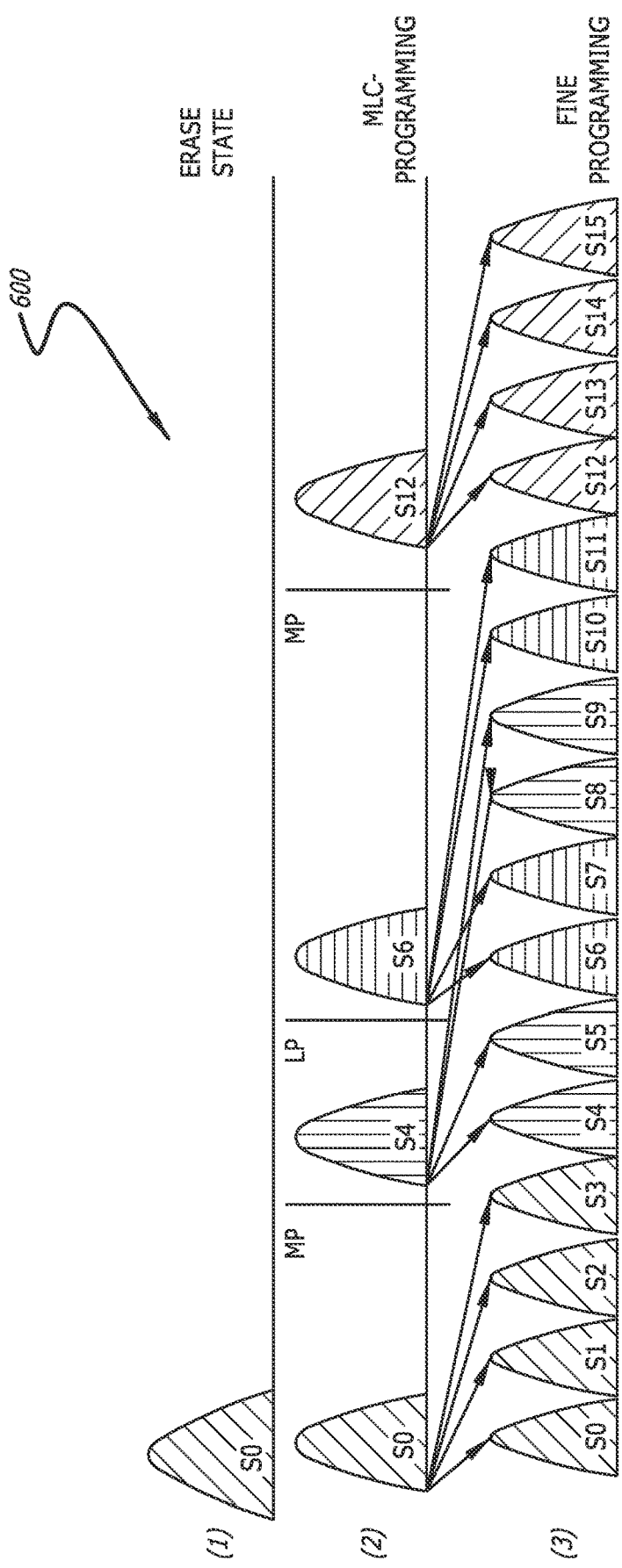
FIG. 6 is a conceptual illustration of an MLC/fine multi-pass programming scheme of a 4-bit memory cell in accordance with an embodiment of the disclosure.

Referring to FIG. 6, a conceptual illustration of an MLC/fine multi-pass programming scheme 600 of a 4-bit memory cell in accordance with an embodiment of the disclosure is shown. Similar to the foggy/fine multi-pass programming depicted in FIG. 5, the MLC/fine method is an alternative way of programming memory devices. The embodiment depicted in FIG. 6 depicts three stages of programming (1)-(3). The first stage of programming is an erase state (1) that resets the memory device back to the ground "S0" state. From here, further voltage can be applied to increase (or "push") the ground state S0 voltage upwards to another state. This second step depicted is the MLC programming step (2) which places the ground state to either one of four memory states (S0, S4, S6, S12). Although each of these memory states (S0, S4, S6, S12) are shown in this embodiments, it is contemplated that other arrangements of memory states may be utilized during the MLC programming step (2).

In various embodiments, the MLC programming step (2) can provide instability as each of the intermediate memory states may vary from their ideal programmed value. In certain embodiments, the values of the voltages associated with each of MLC memory states can be read and stored within other memory devices such as latches. This storage may be done within a more stable/reliable memory device which may be more faithfully recalled later. In many embodiments, once the intermediate memory state values have been stored, the final pass (or passes) are undertaken to set the voltage levels to their final fine programming step (3). Here, each voltage threshold windows corresponds to one or more combinations of data. The embodiment depicted in FIG. 6 is a QLC memory device that comprises sixteen states (S0-S15) to store four bits of data.

Figure 7:
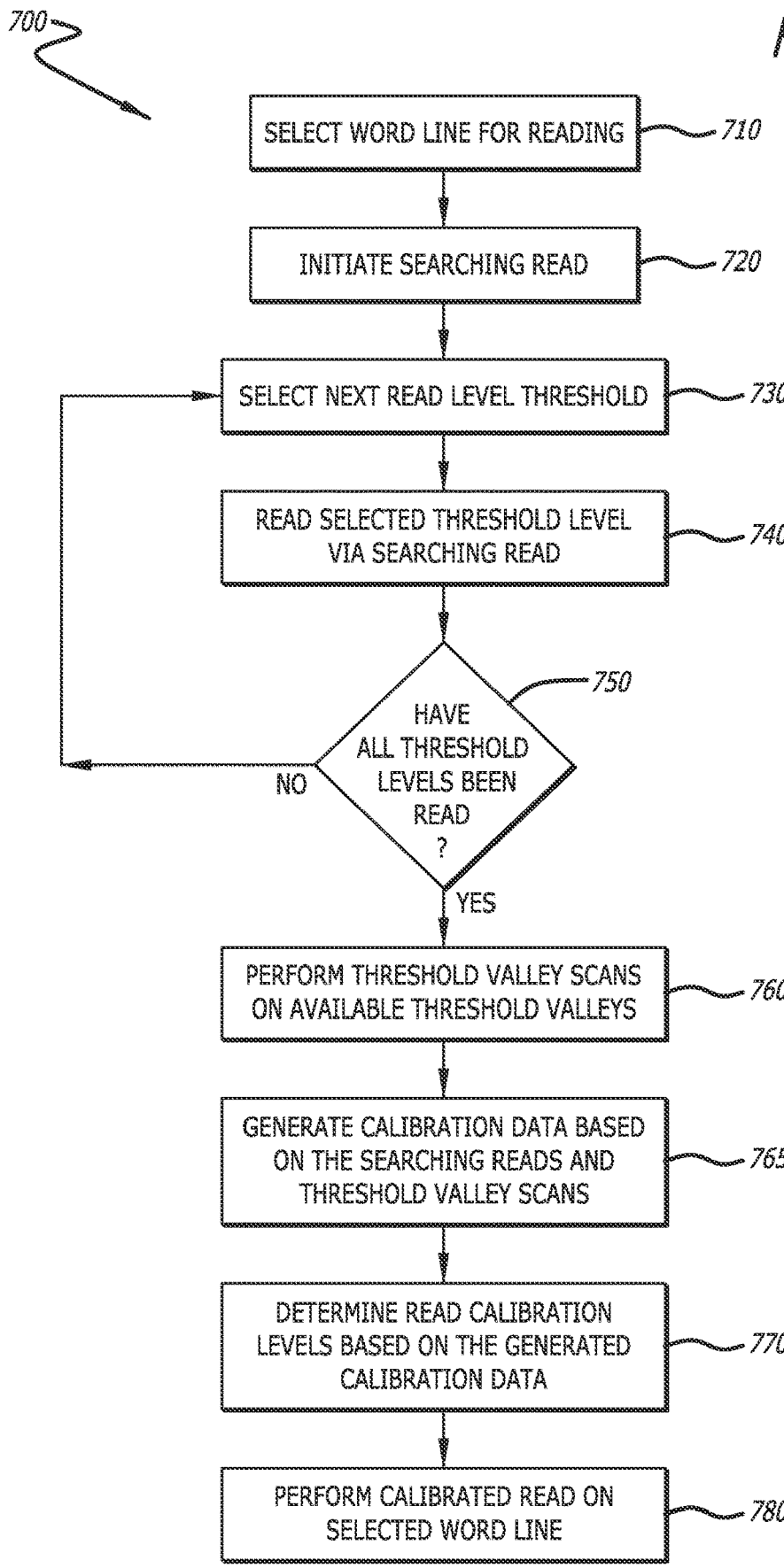
FIG. 7 is a flowchart depicting a process for performing a sequential valley search in accordance with an embodiment of the disclosure.

Referring to FIG. 7, a flowchart depicting a process for performing a sequential valley search in accordance with an embodiment of the disclosure is shown. Valley search operations typically comprise a plurality of threshold valley scans between the voltage threshold memory states within a memory device. These valley searches may be conducted in a variety of ways. FIG. 7 depicts an example sequential process of valley searching that directs all threshold valley scans to be commenced after the searching reads have been completed. This process 700 may be utilized in memory devices that do not have the ability to alternate search reads and threshold valley scans.

The process 700 can select a particular world line that is to be read for data retrieval (block 710). Many embodiments, as detailed below, will select multiple word lines for reading. A searching read process can then be initiated (block 720). A searching read can be performed to gather data regarding the stored threshold voltage that can be utilized to better calibrate a memory reading device. Typically, this may include stepping through and sensing each potential threshold voltage through a series of read levels. While read levels may be configured to match the resulting threshold voltages used to represent stored data, various embodiments may use alternative voltage levels. Thus, a first read level threshold is selected from within the available read levels of the selected memory device (block 730). Once selected, the threshold level is read via a searching read (block 740).

For a searching read, it is contemplated that all threshold levels will be read in many embodiments. The process 700 will attempt to verify that all threshold levels have been read via the searching read (block 750). If there are remaining threshold levels to read within the searching read, the process 700 can select the next read level threshold for reading (block 730). When all threshold levels have been read via the searching read, the process 700 can then begin the valley scan by performing threshold valley scans on the available threshold voltage valleys (block 760).

The resulting searching read and threshold valley search can generate a plurality of calibration data (block 765). The resulting calibration data can be utilized to determine more optimal read calibration levels (block 770). The read calibration levels can then be utilized during a calibrate read operation performed on the selected word lines (block 780). By utilizing this method, fewer read errors may occur, which can extend the overall useful like of the memory device by providing accurate readings even in the event of voltage drift or other perturbance within the memory device.

Figure 8:
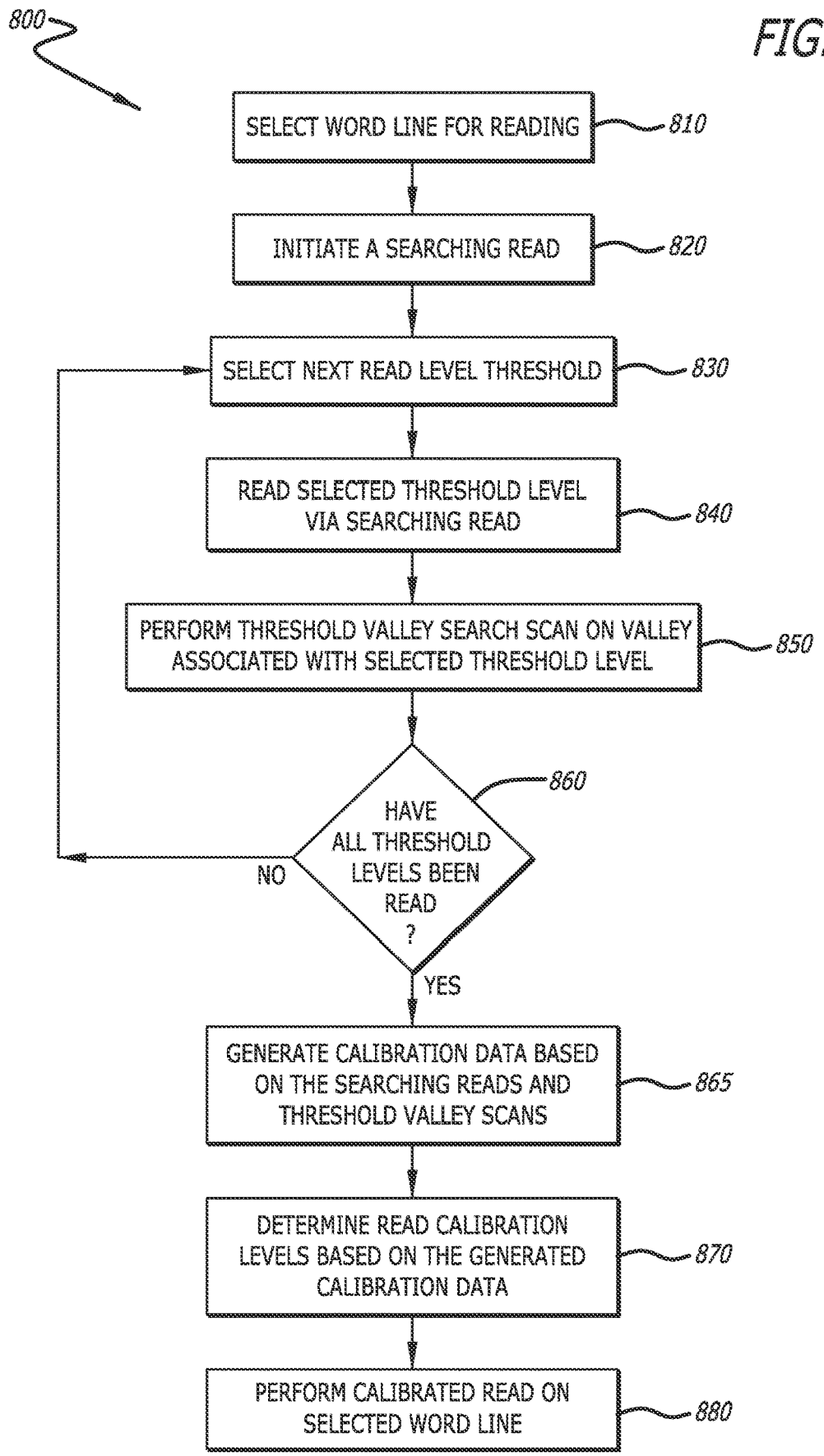
FIG. 8 is a flowchart depicting a process for performing an alternating valley search in accordance with an embodiment of the disclosure.

Referring to FIG. 8, a flowchart depicting a process for performing an alternating valley search in accordance with an embodiment of the disclosure is shown. Similar to the valley search method depicted in FIG. 7, the embodiment depicted in FIG. 8 performs threshold valley scans between various searching reads. In this way, the searching read and valley search alternates between each other at each threshold level until completed. This process 800 may benefit various memory devices whose structures can provide a faster read time when the calibration occurs in this order.

The process 800 can select a particular world line that is to be read for data retrieval (block 810). Many embodiments, as detailed below with respect to dynamic valley searching, will select multiple word lines for reading. A searching read process can be initiated (block 820). A searching read can be performed to gather data regarding the stored threshold voltage that can be utilized to better calibrate a memory reading device. Typically, this may include stepping through and sensing each potential threshold voltage through a series of read levels. As stated above, while read levels may be configured to match the resulting threshold voltages used to represent stored data, various embodiments may use alternative voltage levels. Thus, a read level threshold is selected from within the available read levels of the selected memory device (block 830). Once selected, the threshold level is read via a searching read (block 840).

Unlike the embodiment depicted in FIG. 7, the process 800 can then perform a threshold valley scan of a threshold valley associated (i.e., "next to", or in between the current read level and a next read level) with the current read level (block 850). In many embodiments, the threshold valley scan only commences upon the completion of the searching read for that read level (or associated memory state) has completed, and conversely, any subsequent searching read cannot begin until the threshold valley scan has completed. Thus, the time that the threshold valley scan occurs can directly affect overall read times. As discussed above, the more amount of time the individual valley scans can be performed, the better the overall "resolution" or accurate the results will be. Thus, there is often a balance between providing higher resolution threshold valley searches, and reducing overall read times.

As above, it is contemplated that all threshold levels and associated threshold valleys will be read in most embodiments. Thus, the process 800 will attempt to verify that all threshold levels and associated valley searches have been read (block 860). If there are remaining threshold levels to read within the searching read, the process 800 can select the next read level threshold for reading (block 830). When all threshold levels and associated valley searches have been completed, the process 800 can then generate calibration data based on those completed searching reads and threshold valleys (block 865).

This generated calibration data can be utilized to determine more optimal read calibration levels (block 870). The read calibration levels can then be utilized during a calibrate read operation performed on the selected word lines (block 880). By utilizing this method, fewer read errors may occur, which may also extend the overall useful like of the memory device by providing accurate readings even in the event of voltage drift or other perturbance within the memory device.

Referring to FIG. 9, a flowchart depicting a process for performing a dynamic valley search across multiple planes of memory in accordance with an embodiment of the disclosure is shown. As shown above with respect to FIGS. 7-8, various methods of valley searches may be accomplished when reading data within a memory device. While these methods are shown above to be associated with a single word line, the embodiment depicted in FIG. 9 and other embodiments contemplated and discussed herein can utilize valley searching across multiple planes of memory to reduce the overall time required to complete a calibrated read.

As stated above, most embodiments of memory devices that utilize threshold valley searches are limited by the inability to scan further threshold read levels or memory states until the threshold valley scans are completed. As the number of items to scan increases with increased density memory devices, these bottlenecks can render the use of threshold valley scans obsolete or at least inefficient. To overcome this limitation, dynamic valley searches can utilize the minimal differences between memory devices across multiple planes to shorten the time needed to perform threshold valley searches. In short, the dynamic valley search process can assign each memory state required to be read across various memory planes. By way of example, a storage device may have four memory planes that can each independently access differing memory states within related or associated blocks. The valley search in this example requires four memory states to be measured for a calibrated read, which allows the dynamic valley search process to assign each of the four memory states to be assigned to each of the memory planes which themselves each read one of the four memory states under a process which can be similar to those outlined above with respect to FIGS. 7-8. The resulting calibration data generated across each of the memory planes can then be pooled together and shared with the other planes to perform calibrated reads across all of the blocks across the memory planes, thus reducing the required number of threshold valley scans by up to 75-80%.

The process 900 can first select a plurality of planes for access data (block 910). In various embodiments, requests for data will require accessing memory devices across multiple planes. Each plane may also have corresponding memory devices that can be (generally) assumed to comprise similar physical and/or response characteristics. Based on the memory to be accessed, there may be one or more memory states that must be sensed within the various memory devices among the selected memory planes. The selection of which of these memory states are required for a calibrated read is thusly determined (block 920).

Once the memory states for readings are selected, the process 900 can assign each of the memory states to a unique memory plane (block 930). In many embodiments, the process 900 will attempt to assign only a single memory state to each plane. However, there may be embodiments that require two or more memory state assignments between planes based on the current read requirements. Conversely, additional embodiments may have fewer memory states than there are planes, allowing for one or more memory planes to skip the initial searching read and threshold valley searching. The selection of which memory plane to skip can be dynamically determined based on various factors such as, but not limited to, wear-leveling, currently-running operations, etc.

The process 900 will continue to assign memory states and determine if all states have been assigned between the memory planes (block 940). Once the memory states have all been assigned, the storage device can perform one or more searching reads and/or threshold valley searches across the selected memory planes (block 950). In many embodiments, these processes can be performed similarly to the embodiments depicted above with respect to FIGS. 7 and 8. However, further embodiments will only perform a limited search and/or scan as other threshold levels and/or memory states are being completed by other memory planes.

In response, various calibration data can be generated for each of the selected memory states and/or threshold levels across multiple planes (block 960). As stated above, each of the memory planes may generate a single or partial piece of the entire calibration data for all of the selected memory states. The process 900 can take each of the calibration data generated across each of the memory planes and pool the calibration data together and provide the pooled calibration data back to each of the memory planes (block 965). In this way, each of the memory planes can perform calibrated reads for each of the selected memory states and/or threshold levels utilizing the pooled calibration data (block 970). In a variety of embodiments, the calibration data can be utilized by one or more read sensors within the storage device to respond to a host computing device read command which can reduce the read error rate, thereby providing improved performance through reduced error handling rates.

Referring to FIG. 10, a flowchart depicting a process for utilizing dynamic valley searches within read and write cycles of a storage device in accordance with an embodiment of the disclosure is shown. Various embodiments that utilize dynamic valley searches can be focused on better optimizing data read operations. However, additional embodiments may also be configured to utilize dynamic valley searches to further optimize data writing operations. The process 1000 depicted in FIG. 10 can initially select a plurality of planes to store data via a data write command (block 1010). In many embodiments, the host computing device may issue a standard data write command and leave the storage device (and associated controller and/or logic) to perform the dynamic valley search during the write operation.

For a number of embodiments, the process 1000 of utilizing dynamic valley searches within data write commands is best optimized by operating on the MLC/fine multi-pass programming process (block 1020). Unlike the foggy/fine method of memory device programming, MLC/fine programming requires fewer intermediate memory states. Many storage devices are configured to store (if only temporarily) data associated with these intermediate memory states within one or more memory locations. Typically, the intermediate states are written to a lower-density memory device compared to the memory device that they are being used to write data onto. Thus, utilizing the MLC/fine programming method would allow for the use of fewer intermediate memory latches compared to the foggy/fine programming method. Requiring fewer memory blocks/latches can increase the overall usefulness, capacity, lifespan of the storage device.

However, the MLC/fine programming method creates more data errors compared to the foggy/fine programming method because the fewer intermediate states of the MLC/fine method provide more chances for change and thus data read/write error. However, by utilizing the dynamic valley search process across multiple memory planes, the values of these intermediate memory states can more accurately be read and stored for later use, reducing overall error. Specifically, the MLC/fine programming method will be configured to program at least two memory states within the plurality of pages to the MLC level (block 1030).

The process 1000 can initiate a pre-read search of the plurality of memory devices across multiple memory planes to generate pre-read memory state data (block 1040). In a number of embodiments, this is accomplished via a threshold valley search occurring on each memory plane wherein each memory plane is assigned one memory state (or "page") within the intermediate MLC state which is then utilized to better determine the actual threshold voltage compared to the programmed voltage. This pre-read memory state data can be utilized to optimize the MLC memory states during subsequent dynamic valley searches (block 1050). Once the intermediate memory states/pages have been determined, the process 1000 can store the generated pre-read memory state data into latches (block 1060). Likewise, any other remaining memory state data within the plurality of memory devices into NAND latches (block 1070).

After the intermediate memory state/page data has been stored, the multi-pass programming process can continue to finalize the programming of the memory device from the MLC level to the fine level (block 1080). After final storage, the data can remain within the memory devices until it is subsequently read by the storage device, often utilizing the dynamic valley search method discussed above with respect to FIG. 9 (block 1090). It is contemplated that various embodiments may utilize the dynamic valley search process for writing data to a memory device without utilizing a dynamic valley search for a read process.

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A method of utilizing dynamic valley searches, the method comprising:
writing data to a plurality of planes of a storage device utilizing a multi-pass programming process wherein;
an initial searching read during an intermediate stage of the multi-pass programming process is utilized; and
a series of valley scans is performed to verify the data; and
reading the stored data utilizing a calibrated read derived from an initial searching read comprising at least a series of valley scans performed on planes within the plurality of planes.

2. The method of claim 1, wherein the calibrated read utilizes calibration data.

3. The method of claim 2, wherein the calibrated read utilizes calibration data generated from at least two searching reads and threshold valley scans.

4. The method of claim 3, wherein each of the at least two searching reads and threshold valley scans is performed on unique planes of the plurality of planes.

5. The method of claim 4, wherein the calibration data is based on the at the least two searching reads and threshold valley scans.

6. The method of claim 5, wherein the searching read and threshold valley scan performed on each plane of the plurality of planes utilizes a unique memory state.

7. The method of claim 6, wherein each of the searching reads and threshold valley scans performed on each plane of the plurality of plane generates calibration data associated with the unique memory state.

8. The method of claim 7, wherein the generated calibration data is pooled together for each memory state for use as calibration data across all planes within the plurality of planes.

9. A method of utilizing dynamic valley searches, the method comprising:
writing data to a plurality of planes of a storage device utilizing a multi-pass programming process wherein;
calibration data is generated utilizing:
a searching read is conducted over a plurality of threshold levels during an intermediate stage of the multi-pass programming process; and
a series of valley scans is performed to verify the data; and
reading the stored data via a calibrated read utilizing the previously generated calibration data.

10. The method of claim 9, wherein the searching read comprises at least a series of threshold valley scans on each of the plurality of planes.

11. The method of claim 9, wherein the searching read is conducted over a plurality of threshold levels.

12. The method of claim 11, wherein a valley scan is performed at each of the plurality of threshold levels.

13. The method of claim 9, wherein the calibrated read is performed on a word line.

14. The method of claim 13, wherein each word line associated with the data write undergoes a calibrated read.

15. The method of claim 9, wherein a plurality of memory states are selected within each plane of the plurality of planes.

16. The method of claim 15, wherein a calibrated read is performed on each of the selected plurality of memory states.

17. The method of claim 16, wherein a memory state from the selected plurality of memory states is assigned to a particular plane of the plurality of planes.

18. The method of claim 17, wherein the assigning of the memory states is configured such that each plane of the plurality of planes is assigned a unique memory state from the plurality of selected memory states.

19. A storage device, comprising:

a controller configured to direct the storage device to:

perform an initial searching read associated with data that necessitates access to multiple planes of memory simultaneously, wherein:
- a plurality of memory states for calibration are determined;
- a plurality of threshold valleys between the memory states are determined;
- a series of searching reads and valley scans are performed on the plurality of planes; and generate calibration data based on the initial searching reads.

20. The storage device of claim 19, wherein a memory state is assigned to each of the plurality of planes for performing searching reads.

* * * * *